United States Patent [19]
Hoshi

[11] Patent Number: 5,119,159
[45] Date of Patent: Jun. 2, 1992

[54] LATERAL DMOSFET SEMICONDUCTOR DEVICE WITH REDUCED ON RESISTANCE AND DEVCIE AREA

[75] Inventor: Masakatsu Hoshi, Kanagawa, Japan
[73] Assignee: Nissan Motor Co., Ltd., Japan
[21] Appl. No.: 705,695
[22] Filed: May 29, 1991

[30] Foreign Application Priority Data
Jun. 4, 1990 [JP] Japan .................. 2-144512

[51] Int. Cl.⁵ ............................................ H0iL 27/02
[52] U.S. Cl. ................................. 357/43; 357/23.4; 357/13; 357/86
[58] Field of Search ................. 357/23.4, 13, 43, 86

[56] References Cited
U.S. PATENT DOCUMENTS
5,065,213 11/1991 Frisina et al. .................. 357/43

Primary Examiner—Edward J. Wojciechowicz
Attorney, Agent, or Firm—Lowe, Price, LeBlanc & Becker

[57] ABSTRACT

A lateral DMOSFET device with a small on resistance and a small device area. The device includes a high concentration first semiconductor region of a first conductivity type; a second semiconductor region of a second conductivity type provided on one side of the first semiconductor region; a base region of the first conductivity type formed inside the second semiconductor region, which is reaching to the first semiconductor region; a high concentration source region of the second conductivity type formed inside the base region; a channel region of the first conductivity type formed inside the second semiconductor region around the source region; a high concentration drain region of the second conductivity type formed inside the second semiconductor region and outside the base region; a source electrode connected to the source region; a gate electrode provided over the source region and the channel region; a drain electrode connected to the drain region; and a base electrode, provided on another side of the first semiconductor region, for maintaining a voltage level of the base region at constant level.

10 Claims, 7 Drawing Sheets

LATERAL DMOSFET SEMICONDUCTOR DEVICE WITH REDUCED ON RESISTANCE AND DEVCIE AREA

BACKGROUND OF THE INVENTION

1. Field of the Invention

The present invention relates to a semiconductor device, and more particularly to a semiconductor device in a form of a lateral DMOSFET.

2. Description of the Background Art

There are two types of a conventional power DMOSFET device, including a vertical DMOSFET (VDMOS) which has a drain electrode on a back side of a substrate, and a lateral DMOSFET (LDMOS) which has a drain electrode formed on a top side of a substrate by using an n-type buried layer and an n+-type diffusion layer.

Now, an example of a conventional n-channel type VDMOS shown in FIG. 1 will be described.

In this n-channel type VDMOS, an n+-type diffusion layer 4 functioning as a source region is formed inside a p-type diffusion layer 3, which is formed inside an n-type epitaxial layer 2 formed on an n⁻-type silicon substrate 12. Also, on a top side of the n-type epitaxial layer 2, a gate electrode 7 is formed on a gate insulation film 6 formed over the p-type diffusion layer 3 functioning as a channel region and the n⁻-type diffusion layer 4 functioning as a source region. The gate electrode 7 is covered by an interlayer insulation film 8, over which a source electrode 16 is formed. In addition, on a back side of the n⁻-type silicon substrate 12 which functions as a drain region, there is formed a drain electrode 13.

In such a VDMOS, the source electrode 16 and the drain electrode 13, which are main passages for the current, are separately provided on the top and back sides of the substrate 12, so that there is no need to collect the current planewise. As a result, the resistance and the area loss due to these components are reduced such that there has been an advantage that the on resistance can be lowered considerably.

However, such a VDMOS has been associated with the following problems.

First, because the drain region is formed by the n+-type silicon substrate 12, it has been difficult to form a plurality of VDMOSs on a single substrate, and operating each of them independently, or to form a VDMOS along with other devices such as a CMOS or a bipolar IC.

Secondly, the on resistance is parasitically introduced into the substrate resistance in such a VDMOS.

It has recently become popular in the VDMOS to reduce the on resistance by using finer p-type diffusion layer 3 and n+-type diffusion layer 4 manufactured by the improved fine manufacturing technique.

On the other hand, an example of one type of a conventional n-channel type LDMOS is shown in FIG. 2, which will now be described.

In this n-channel type LDMOS, an n+-type diffusion layer 4 is formed inside a p-type diffusion layer 3, which is formed inside an n-type epitaxial layer 2 formed on a p-type silicon substrate 1. Also, on a top side of the n-type epitaxial layer 2, a gate electrode 7 is formed on a gate insulation film 6 formed over the p-type diffusion layer 3 functioning as a channel region and the n+-type diffusion layer 4 functioning as a source region. The gate electrode 7 is covered by an interlayer insulation film 8, over which a source electrode 16 is formed. In addition, there is provided an n-type diffusion layer 15 which is making a contact with an n⁻-type buried layer 14 formed between the p-type silicon substrate 1 and the n-type epitaxial layer 2, and an n+-type diffusion layer 5 is formed inside the n-type diffusion layer 15, such that a drain electrode 17 can be formed over the n+-type diffusion layer 5 on a top side of the p-type silicon substrate 1.

In such an LDMOS, because it is entirely formed on the grounded p-type silicon layer 1, there has been advantages that such an LDMOS can be formed along with the other electrically isolated devices or LDMOSs, and the effect of the substrate resistance on the on resistance is very small.

However, there has also been a problem that the device area have to be enlarged in order to incorporate the n-type diffusion layer 15 and the drain electrode 17. The area required for this reason needs to be as large as that covered by the source electrode, in order to have the drain current flow.

Now, the reduction of the on resistance by using the improved fine manufacturing technique, popularly exercised for a VDMOS as already mentioned above, is not effective in reducing the dead space in the LDMOS, so that the extent by which the on resistance can be reduced has been rather limited in the LDMOS.

Also, in this type of LDMOS, there has been a problem that although the substrate resistance is very small, the parasitic drain resistance due to the resistance of n-type diffused layer and n+-type buried layer is large. This parasitic drain resistance can be reduced effectively by enlarging the total area of the n-type diffusion layer 15 so as to reduce the distance that the current have to travel through the n+-type buried layer 14. However, this in turn increases the dead space in the LDMOS.

Thus, the on resistance in this type of the LDMOS has usually been over twice as large as the VDMOS of the same device area. For this reason, the use of this type of the LDMOS has been limited to cases involving a small or medium amount of current only. For a case involving a large amount of current such as that over 10A, the device area of the LDMOS becomes practically too large.

There is also another type of an LDMOS in which the current flows along the substrate surface, which is shown in FIG. 3 and will now be described.

In this LDMOS of FIG. 3, a p-type diffusion layer 3 functioning as a channel region and an n+-type diffusion layer 5 functioning as a drain contact region are formed inside an n-type epitaxial layer 2 formed on a p-type silicon substrate 1. Inside the p-type diffusion layer 3, n+-type diffusion layer 4 functioning as a source region is formed. Also, on a top side of the p-type silicon substrate 1, a gate electrode 7 is formed on a gate insulation film 6 formed over the p-type diffusion layer 3 and the n+-type diffusion layer 4. The gate electrode 7 is covered by an interlayer insulation film 8, over which a source electrode 16 is formed. In addition, over the n+-type diffusion layer 5, a drain electrode 17 is formed on a top side of the p-type silicon substrate 1.

In such an LDMOS, just as in the LDMOS of FIG. 2 described above, because it is entirely formed on the grounded p-type silicon layer 1, there is an advantage that such an LDMOS can be formed along with the other electrically isolated devices or LDMOSs.

Furthermore, in this type of the LDMOS, the parasitic drain resistance can be reduced as there is no $n^+$-type buried layer 14 through which the current have to pass.

However, this type of the LDMOS is also associated with the problem of the enlargement of the device size due to the inclusion of the $n^-$-type diffusion layer 5 and the drain electrode 17, which gives rise to the problem of the larger dead space for the larger current capacity, as in the LDMOS of FIG. 2.

Moreover, in this type of the LDMOS, it is necessary to form the source region 4 and a base region contact window 3' on a surface of the p-type diffusion layer (base region) 3, so that the mask matching becomes necessary, and therefore the base region 3 can be made smaller only to a limited extent.

Thus, the on resistance in this type of the LDMOS has also usually been over twice as large as the VDMOS of the same device area.

There is also a proposition of a double layer structure for this type of the LDMOS as shown in FIG. 4, in which a source electrode 11 and a drain electrode 9 are formed in a shape of a double layer with an intermediate insulation layer 10 formed between the source electrode 11 and the drain electrode 9.

Such an LDMOS having a double layer structure has an advantage of being capable of reducing the area due to the drain electrode. However, this type of the LDMOS also has a necessity to form the source region 4 and a base region contact window 3' on a surface of the p-type diffusion layer (base region) 3, just as in the LDMOS of FIG. 3, so that the mask matching becomes necessary, and therefore the base region 3 can be made smaller only to a limited extent.

Thus, the conventional LDMOS is known to be advantageous in that it is suitable for being integrated with the other devices or made into multiple output configuration, as it has the drain electrode on the top side of the substrate, but it also has the problem of having the higher on resistance compared with the VDMOS which has the drain electrode on the back side of the substrate, such that it is less desirable in terms of costs, as well as in terms of the limit on the current capacity.

Also, in the LDMOS, since the current flows mostly on the top side of substrate, the effect of the substrate resistance becomes small. However, the device area have to be enlarged in order to incorporate the drain electrode 17.

SUMMARY OF THE INVENTION

It is therefore an object of the present invention to provide a lateral DMOSFET device which has a small on resistance and a small device area.

According to one aspect of the present invention there is provided a lateral DMOSFET semiconductor device, comprising: a high concentration first semiconductor region of a first conductivity type; a second semiconductor region of a second conductivity type provided on one side of the first semiconductor region; a base region of the first conductivity type formed inside the second semiconductor region, which is reaching to the first semiconductor region; a high concentration source region of the second conductivity type formed inside the base region; a channel region of the first conductivity type formed inside the second semiconductor region around the source region; a high concentration drain region of the second conductivity type formed inside the second semiconductor region and outside the base region; a source electrode, provided on said one side of the second semiconductor region, which is connected to the source region; a gate electrode, provided on said one side of the second semiconductor region, over the source region and the channel region; a drain electrode, provided on said one side of the second semiconductor region, which is connected to the drain region; and a base electrode, provided on another side of the first semiconductor region, for maintaining a voltage level of the base region at constant level.

According to another aspect of the present invention there is provided a power MOSFET semiconductor device, comprising: a semiconductor substrate; a high concentration first semiconductor region of a first conductivity type, provided on one side of the semiconductor substrate; a second semiconductor region of a second conductivity type provided on said one side of the first semiconductor region; a plurality of base regions of the first conductivity type formed inside the second semiconductor region, each of which is reaching to the first semiconductor region; a high concentration source region of the second conductivity type formed inside each of the base regions; a channel region of the first conductivity type formed inside the second semiconductor region around the source region; a high concentration drain region of the second conductivity type formed inside the second semiconductor region and outside the base regions; a source electrode, provided on said one side of the second semiconductor region, which is connected to the source region; a gate electrode, provided on said one side of the second semiconductor region, over the source region and the channel region; a drain electrode, provided on said one side of the second semiconductor region, which is connected to the drain region; and a high concentration third semiconductor region of the first conductivity type formed inside the second semiconductor region, which is making contacts with the source electrode and the first semiconductor region.

Other features and advantages of the present invention will become apparent from the following description taken in conjunction with the accompanying drawings.

DETAILED DESCRIPTION OF THE PREFERRED EMBODIMENTS

Now, the lateral DMOSFET device according to the present invention will be described in detail.

First, the general feature of the LDMOS according to the present invention which is common to all the embodiments to be described below will be summarized as follows.

In an LDMOSFET device according to the present invention, there is provided a high concentration first semiconductor region of a first conductivity type, and an LDMOSFET configuration is formed in a second semiconductor region of a second conductivity type provided on one side of the first semiconductor region, where the LDMOSFET configuration includes a base region of the first conductivity type which is reaching to the first semiconductor region, a source region of the second conductivity type formed inside the base region, and a drain region of the second conductivity type formed outside the base region.

In addition, a base electrode is provided on the other side of the first semiconductor region such that the voltage level of the base region can be maintained to be constant by the base electrode through the first semiconductor region.

As a result, the mask matching is unnecessary in forming the source region because there is no need to form a base region contact window on a base region surface, and consequently, the base region can be made smaller and at the same time the on resistance can be reduced.

Figure 1:
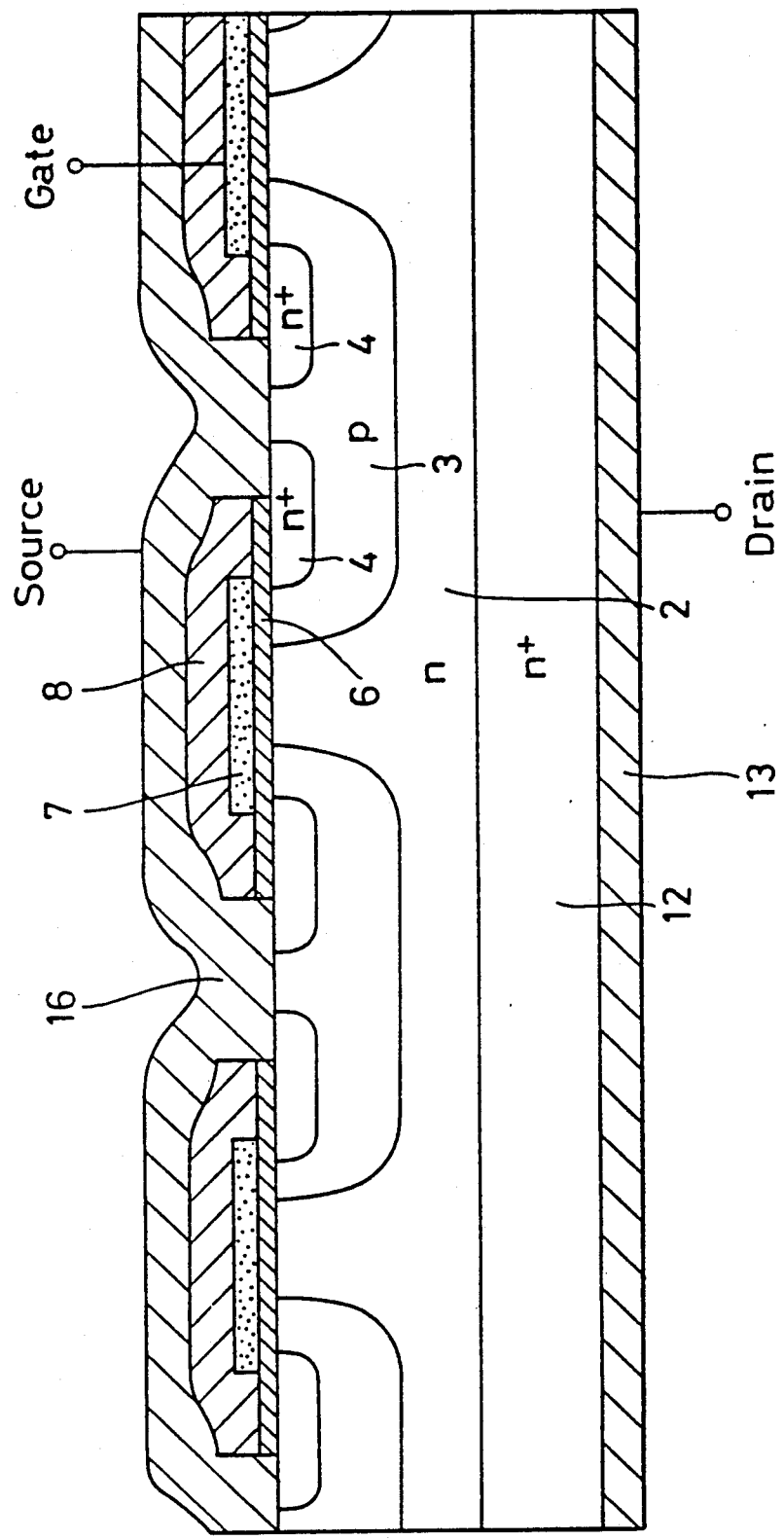
FIG. 1 is a cross sectional view of a conventional VDMOSFET device.
Figure 2:
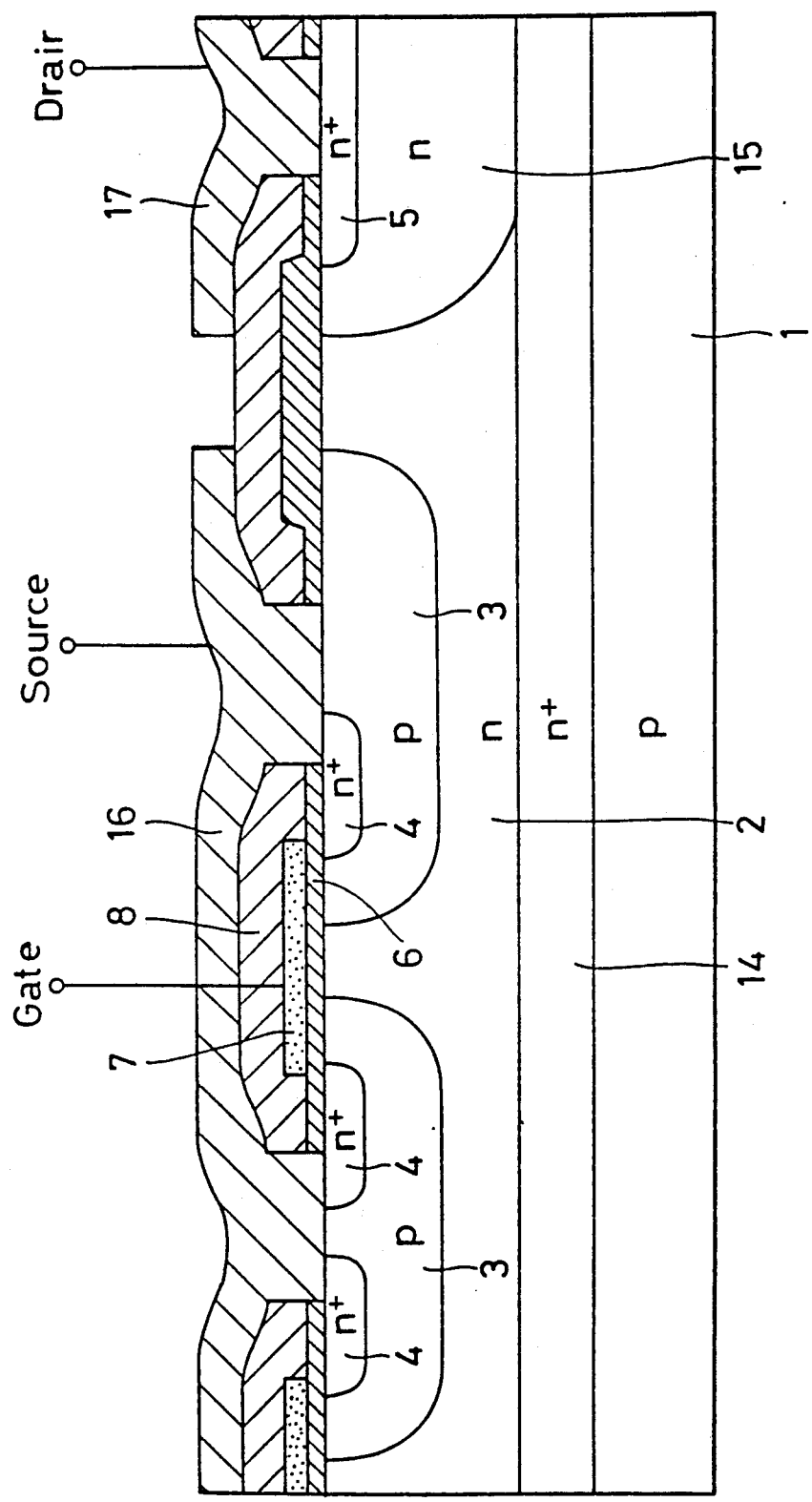
FIG. 2 is a cross sectional view of one example of a conventional LDMOSFET device.
Figure 3:
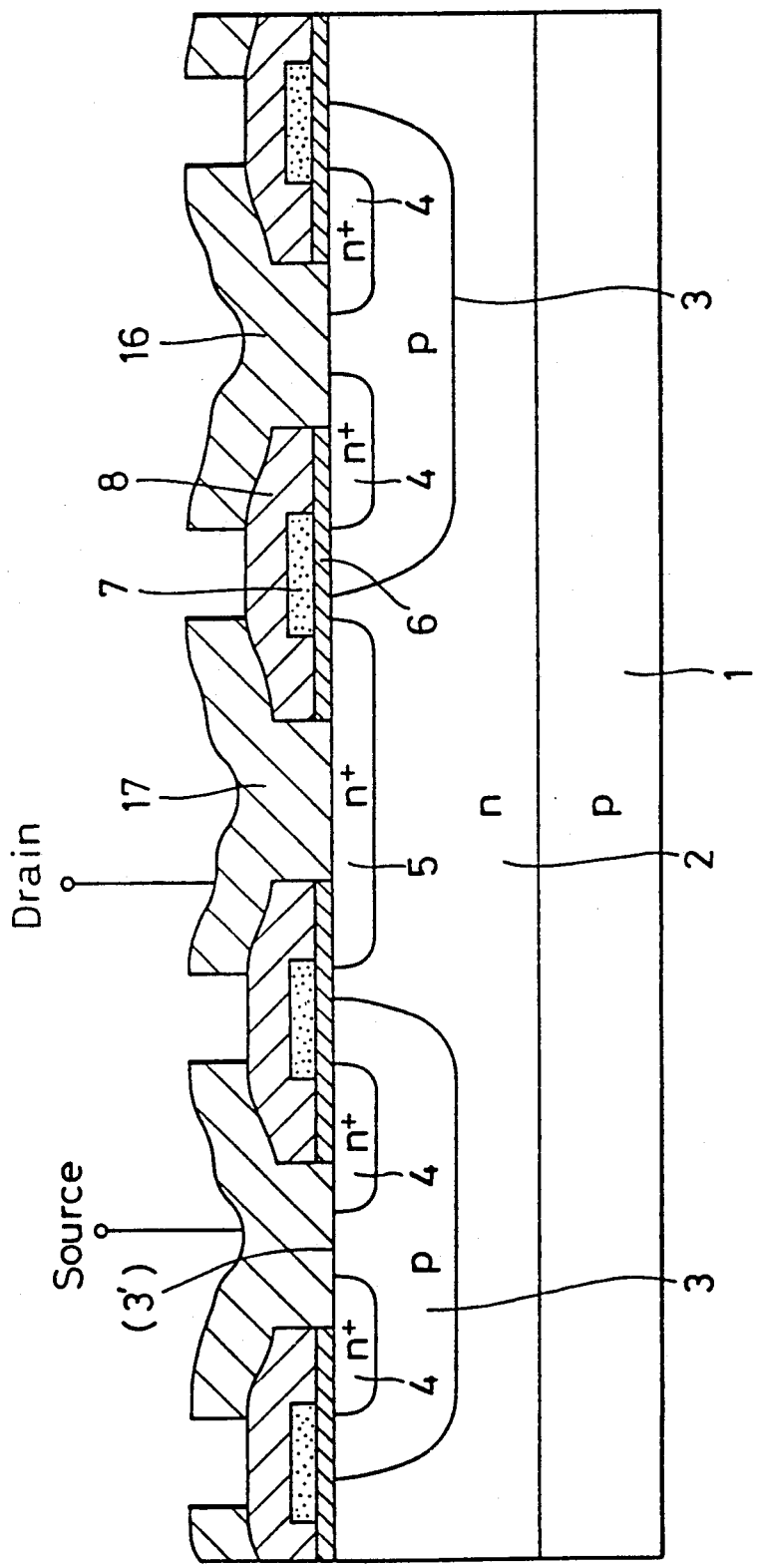
FIG. 3 is a cross sectional view of another example of a conventional LDMOSFET device.
Figure 4:
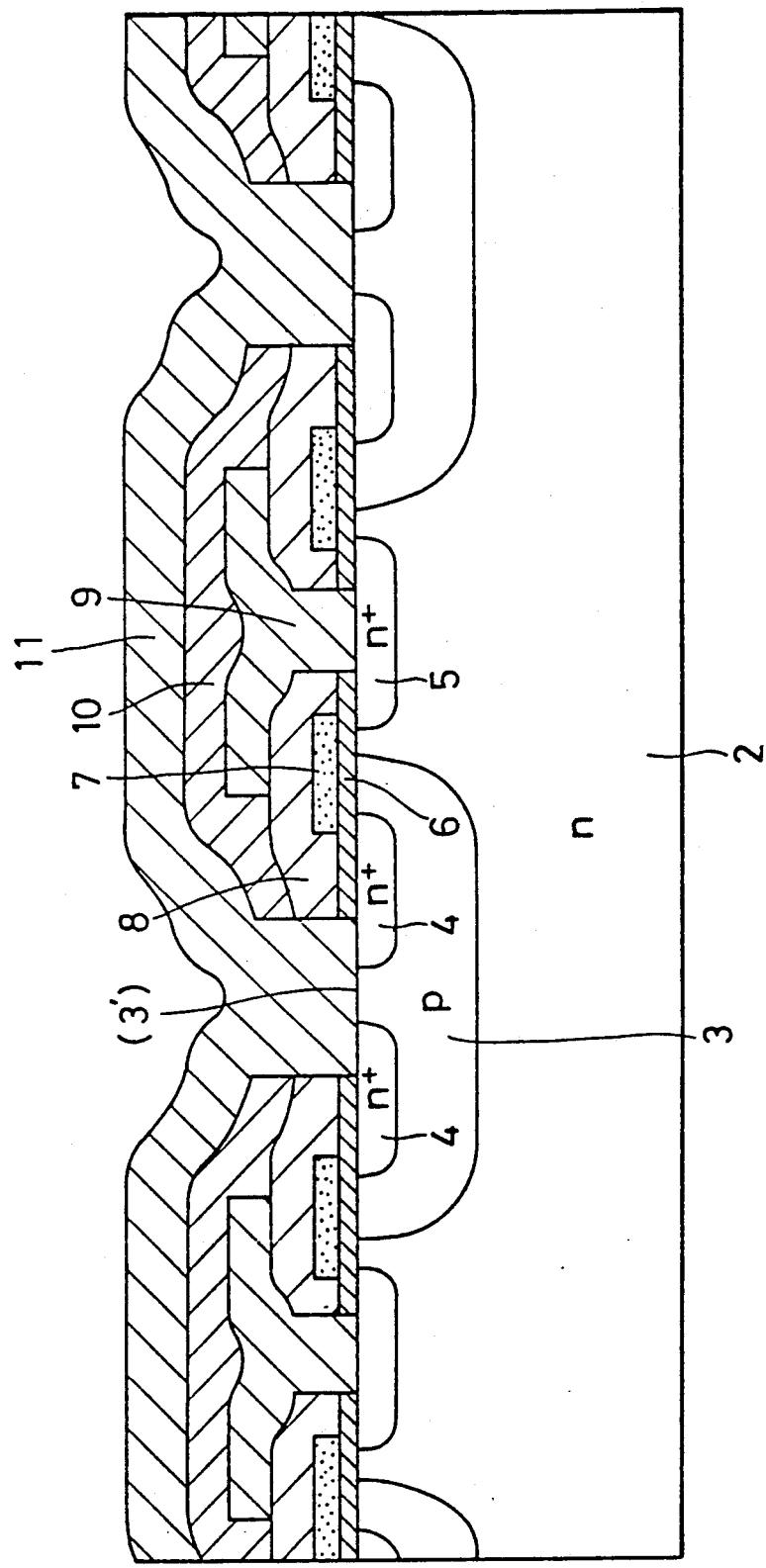
FIG. 4 is a cross sectional view of still another example of a conventional LDMOSFET device, which has a double payer structure.
Figure 5:
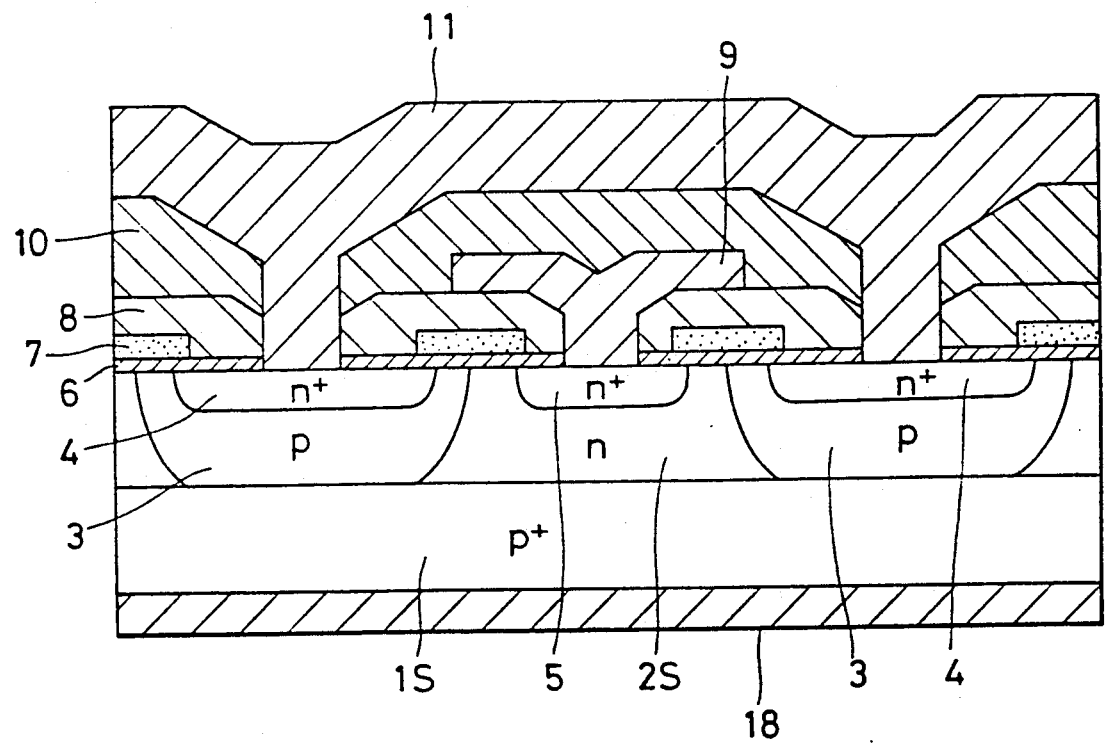
FIG. 5 is a cross sectional view of a first embodiment of an LDMOSFET device according to the present invention.

Referring now to FIG. 5, the first embodiment of an LDMOSFET device according to the present invention will be described in detail.

In this first embodiment of the LDMOSFET device, there is provided a high concentration p-type silicon substrate 1S, and an LDMOSFET configuration is formed in an n-type silicon layer 2S provided on a top side of the silicon substrate 1S.

Here, the LDMOSFET configuration comprises: a p-type diffusion layer 3 functioning as a channel region and an n+-type diffusion layer 5 functioning as a drain contact region which are formed inside an n-type silicon epitaxial layer 2S formed on the top side of the p-type silicon substrate 1S; an n+-type diffusion layer 4 functioning as a source region which is formed inside the p-type diffusion layer 3; a gate electrode 7 made of a poly-crystalline silicon layer which is formed on a top side of the n-type silicon layer 2S through a gate insulation film 6 formed over the p-type diffusion layer 3 and the n+-type diffusion layer 4; an interlayer insulation film 8 covering the gate electrode 7; a source electrode 11 which is formed over the interlayer insulation film 8 and a drain electrode 17 which is formed on a top side of the n-type silicon layer 2S over the n+-type diffusion layer 5, where the source electrode 11 and the drain electrode 9 are formed in a shape of a double layer with an intermediate insulation layer 10 formed between the source electrode 11 and the drain electrode 9.

In addition, a base electrode 18 is provided on a back side of the p-type silicon substrate 1S, such that the voltage level of the base region can be maintained to be constant at the source voltage level by this base electrode 18 through the p-type silicon substrate 1S.

With this configuration, the mask matching is unnecessary in forming the source region because there is no need to form a base region contact window on a base region surface, and consequently, the base region can be made smaller and at the same time the on resistance can be reduced.

Moreover, because all of the source electrode 11, drain electrode 9, and gate electrode 7 are formed on the top side of the p-type silicon substrate 1S, this LDMOSFET device also has a general advantage of the LDMOS that it can be formed along with the other electrically isolated devices or LDMOSs on a single substrate, with each of them operated independently, such that a multiple output device or a power IC can be formed easily.

Figure 6:
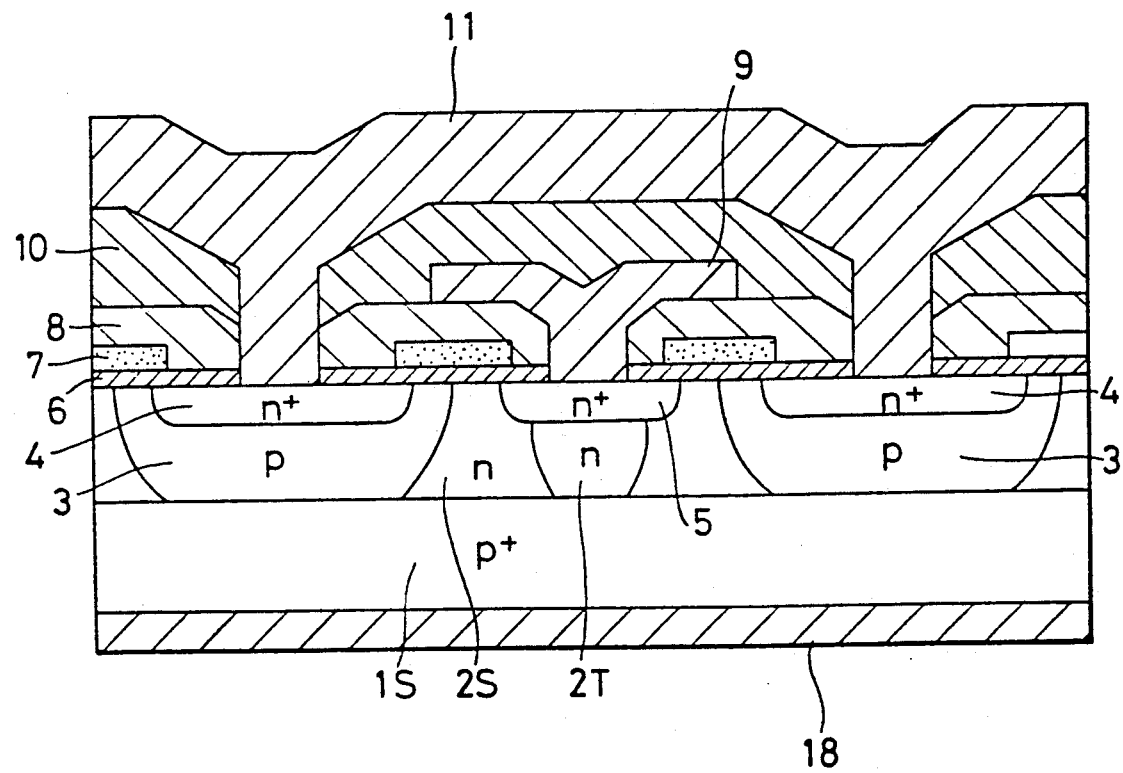
FIG. 6 is a cross sectional view of a second embodiment of an LDMOSFET device according to the present invention.

Referring now to FIG. 6, the second embodiment of an LDMOSFET device according to the present invention will be described in detail.

This second embodiment of FIG. 6 differs from the first embodiment of FIG. 5 in that an additional n-type silicon layer 2T having a concentration different from that of the n-type silicon layer 2S is provided between the high concentration n-type diffusion layer 5 functioning as the drain contact region and the high concentration p-type silicon substrate 1S, while the remaining configuration is the same as the first embodiment of FIG. 5.

In this configuration, a breakdown voltage of a diode formed by the high concentration n-type diffusion layer 5, the additional n-type silicon layer 2T, and the high concentration p-type silicon substrate 1S is made to be equal to or less than a breakdown voltage of a diode formed by the high concentration n-type diffusion layer 5, the n-type silicon layer 2S, and the base region 3, such that the flow of the surge currents into the base region 3 is prevented in order to improve the avalanche capability.

Here, it is to be noted that the n-type silicon layer 2T can be replaced by a p-type silicon layer as long as the above described condition on the breakdown voltages can be fulfilled.

Thus, in this second embodiment of FIG. 6, the improvement can be achieved not only in the device area and the on resistance, but also in the avalanche capability.

Figure 7:
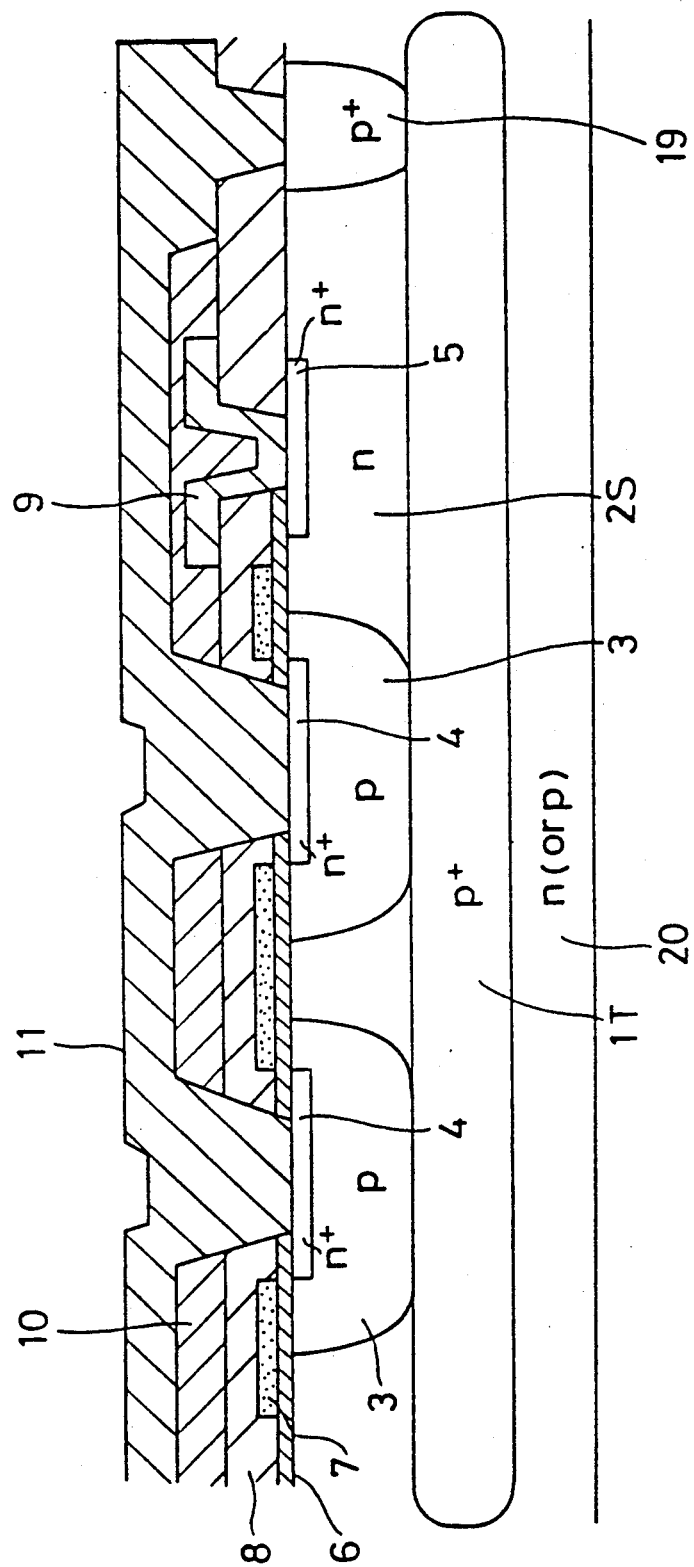
FIG. 7 is a cross sectional view of a third embodiment of an LDMOSFET device according to the present invention.

Referring now to FIG. 7, the third embodiment of an LDMOSFET device according to the present invention will be described in detail.

This third embodiment of FIG. 7 is a power MOSFET having a plurality of base regions, where instead of the base electrode 18 and the high concentration p-type silicon substrate 1S of the first embodiment shown in FIG. 5, there is provided a high concentration p-type buried layer 1T formed on a surface of an n-type (or p-type) silicon substrate 20, and a high concentration p-type semiconductor region 19 formed inside the n-type silicon layer 2S such that this semiconductor region 19 makes direct contacts with the source electrode 11 on an upper side and with the p-type buried layer 1T on an lower side, such that the base electrode can be brought up to the top side of the substrate. The remaining configuration is the same as the first embodiment of FIG. 5.

With this configuration, in addition to the advantages described for the first embodiment of FIG. 5 above, all the electrodes can be formed on the top side of the substrate, so that the formation and connection of the electrodes can be simplified in a manufacturing process.

In particular, in a case of a power MOSFET having a plurality of base regions, all the base regions are connected to the high concentration p-type buried layer 1T, so that in this third embodiment of FIG. 7, the base can be brought up to the top side of the substrate at a single location with respect to the p-type buried layer 1T, such that the device size can be reduced easily.

It is to be noted that many modifications and variations of the above embodiments may be made without departing from the novel and advantageous features of the present invention. Accordingly, all such modifications and variations are intended to be included within the scope of the appended claims.

What is claimed is:

1. A lateral DMOSFET semiconductor device, comprising:
    a high concentration first semiconductor region of a first conductivity type;
    a second semiconductor region of a second conductivity type provided on one side of the first semiconductor region;
    a base region of the first conductivity type formed inside the second semiconductor region, which is reaching to the first semiconductor region;
    a high concentration source region of the second conductivity type formed inside the base region;
    a channel region of the first conductivity type formed inside the second semiconductor region around the source region;
    a high concentration drain region of the second conductivity type formed inside the second semiconductor region and outside the base region;
    a source electrode, provided on said one side of the second semiconductor region, which is connected to the source region;
    a gate electrode, provided on said one side of the second semiconductor region, over the source region and the channel region;
    a drain electrode, provided on said one side of the second semiconductor region, which is connected to the drain region; and
    a base electrode, provided on another side of the first semiconductor region, for maintaining a voltage level of the base region at constant level.

2. The lateral DMOSFET semiconductor device of claim 1, wherein the source electrode and the drain electrode are provided in a shape of a double layer structure.

3. The lateral DMOSFET semiconductor device of claim 1, further comprising an additional layer of the second conductivity type provided inside the second semiconductor region, which ia making contacts with the drain region and the first semiconductor region.

4. The lateral DMOSFET semiconductor device of claim 3, wherein a breakdown voltage of a diode formed by the drain region, the additional layer, and the first semiconductor region is made to be not greater than a breakdown voltage of a diode formed by the drain region, the second semiconductor region, and the base region.

5. The lateral DMOSFET semiconductor device of claim 1, further comprising an additional layer of the first conductivity type provided inside the second semiconductor region, which is making contacts with the drain region and the first semiconductor region.

6. The lateral DMOSFET semiconductor device of claim 5, wherein a breakdown voltage of a diode formed by the drain region, the additional layer, and the first semiconductor region is made to be not greater than a breakdown voltage of a diode formed by the drain region, the second semiconductor region, and the base region.

7. The lateral DMOSFET semiconductor device of claim 1, wherein the first semiconductor region is provided as a semiconductor substrate.

8. A power MOSFET semiconductor device, comprising:
    a semiconductor substrate;
    a high concentration first semiconductor region of a first conductivity type, provided on one side of the semiconductor substrate;
    a second semiconductor region of a second conductivity type provided on said one side of the first semiconductor region;
    a plurality of base regions of the first conductivity type formed inside the second semiconductor region, each of which is reaching to the first semiconductor region;
    a high concentration source region of the second conductivity type formed inside each of the base regions;
    a channel region of the first conductivity type formed inside the second semiconductor region around the source region;
    a high concentration drain region of the second conductivity type formed inside the second semiconductor region and outside the base regions;
    a source electrode, provided on said one side of the second semiconductor region, which is connected to the source region;
    a gate electrode, provided on said one side of the second semiconductor region, over the source region and the channel region;
    a drain electrode, provided on said one side of the second semiconductor region, which is connected to the drain region; and
    a high concentration third semiconductor region of the first conductivity type formed inside the second semiconductor region, which is making contacts with the source electrode and the first semiconductor region.

9. The lateral DMOSFET semiconductor device of claim 8, wherein the third semiconductor region is provided at a single location inside the second semiconductor region with respect to the plurality of the base regions.

10. The lateral DMOSFET semiconductor device of claim 8, wherein the first semiconductor region is provided as a buried layer.

* * * * *